United States Patent [19]

Tarzaiski et al.

[11] Patent Number: 4,942,400
[45] Date of Patent: Jul. 17, 1990

[54] ANALOG TO DIGITAL CONVERTER WITH MULTILAYER PRINTED CIRCUIT MOUNTING

[75] Inventors: Richard J. Tarzaiski, Magnolia; Richard C. Hwang, Mt. Laurel Township, Burlington County both of N.J.

[73] Assignee: General Electric Company, Moorestown, N.J.

[21] Appl. No.: 478,102

[22] Filed: Feb. 9, 1990

[51] Int. Cl.⁵ .................. H03M 1/36; H01R 9/00
[52] U.S. Cl. ................... 341/155; 174/261; 361/404
[58] Field of Search ............. 341/126, 133, 134, 155, 341/158, 899; 174/260–261; 361/394, 395, 397–401, 404, 411, 417

[56] References Cited

U.S. PATENT DOCUMENTS

| | | | |
|---|---|---|---|
| 4,378,502 | 3/1983 | Clarke | 361/397 |
| 4,580,193 | 4/1986 | Edwards | 361/397 |
| 4,686,506 | 8/1987 | Farago | 341/100 |
| 4,712,161 | 12/1987 | Pryor et al. | 361/411 |
| 4,724,383 | 2/1988 | Hart | 361/397 |
| 4,875,047 | 10/1989 | Baba | 341/155 |

Primary Examiner—Vit W. Miska
Attorney, Agent, or Firm—William H. Meise

[57] ABSTRACT

An analog-to-digital converter (ADC) arrangement mounts at least one ADC integrated circuit on a six-layer printed circuit board including an analog ground plane in a second layer occupying a region distinct from a digital ground plane in a fifth layer. Analog signals are carried over paths of a first layer overlying the second layer ground plane. The analog signal paths may be configured as microstrip transmission lines. Digital signals produced by the IC are coupled onto digital signal paths overlying the digital ground plane. Third and fourth layers of the six-layer printed circuit board carry power to signal conditioning circuits. Conditioned power is coupled to the ADC integrated circuit and any other IC's.

4 Claims, 1 Drawing Sheet

ANALOG TO DIGITAL CONVERTER WITH MULTILAYER PRINTED CIRCUIT MOUNTING

BACKGROUND OF THE INVENTION

This invention relates to analog-to-digital converters, and particularly to mountings therefor for providing low noise operation.

Many modern control systems are implemented in a digital format. Controllers for real-world systems, however, must often respond to analog stimuli. An analog stimulus is ordinarily detected by a sensor which produces an analog electrical signal representative of the stimulus. An analog-to-digital converter (ADC) converts the analog signal into a digital signal, which is used to drive the digital control system. The limitations of the analog-to-digital converter are often important in the overall system being controlled.

Low noise and high speed operation are desirable in an analog-to-digital converter arrangement.

SUMMARY OF THE INVENTION

A multilayer printed circuit board is used for mounting an analog-to-digital converter integrated circuit. The printed circuit board in a particular embodiment of the invention includes six layers of conductor. The printed circuit board is organized into an analog portion and a digital portion. In the analog portion, analog signal-carrying traces overlie an analog ground plane. In the digital portion, digital signal-carrying traces overlie a digital ground plane. The analog and digital ground planes are connected together only in a region near the corresponding ground pins of an ADC integrated circuit. A further pair of layers of conductor of the printed circuit board coupled direct power from off the printed circuit board to on-board power conditioning circuits such as regulators, and couple the conditioned power which they generate to the ADC integrated circuit. Differential drivers coupled to the digital ground plane and to the digital signal traces convert signals from single ended to differential mode for coupling digital signals away from the printed circuit board without further direct connection to the digital ground plane. In a particular embodiment of the invention, the analog signal paths are configured as microstrip transmission lines.

DESCRIPTION OF THE INVENTION

Figure 1:
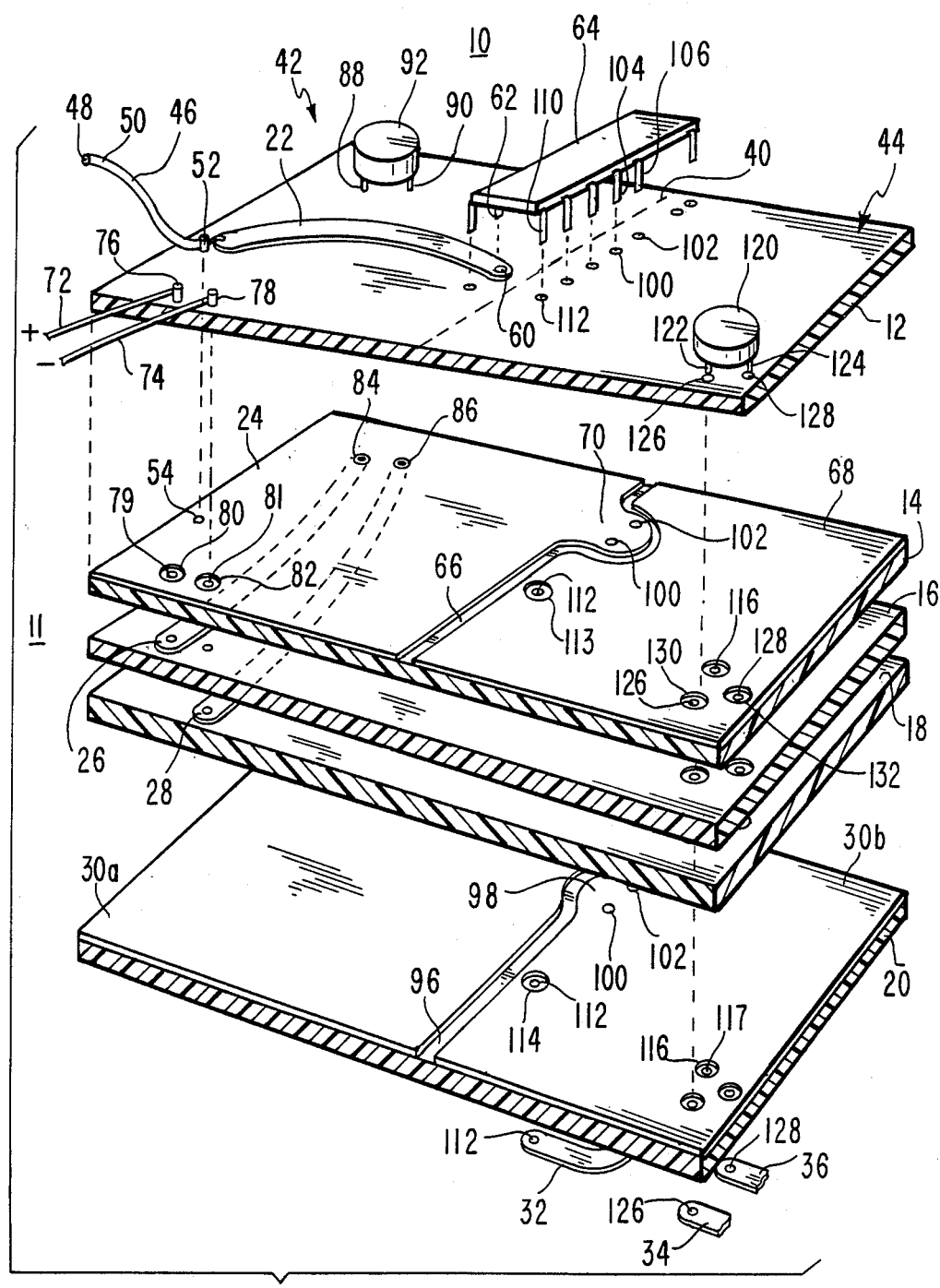
FIG. 1 is a simplified exploded view of a six-layer printed circuit board in accordance with the invention for supporting an integrated-circuit ADC and ancillary circuits.

FIG. 1 is a simplified exploded view of an analog-to-digital converter (ADC) according to the invention. In FIG. 1, an assemblage 10 includes a printed circuit board designated generally as 11. Board 11 includes five dielectric layers 12, 14, 16, 18 and 20, and six conductive layers. A first conductive layer is represented by a conductive trace 22 on the upper side of dielectric layer 12. A second conductive layer is represented by a first layer portion 24 and a second layer portion 68, separated from each other by a gap 66. Both portions 24 and 68 of the second layer overlies dielectric layer 14. Third and fourth conductive layers are represented in FIG. 1 by conductive traces 26 and 28 overlying dielectric layers 16 and 18, respectively. A fifth conductive layer is represented by a conductive layer 30 including portions 30a and 30b, separated by a gap 96. Conductive layer 30 overlies dielectric layer 20. A sixth layer is represented by further conductive paths, 32, 34, 36, which are illustrated as exploded away from the underside of dielectric layer 20, but which actually are attached to the lower surface of layer 20. While conductive layers are described as "overlying" a dielectric layer, when the entire printed circuit board 11 of FIG. 1 is assembled, all intermediate conductive layers are in intimate contact with two adjacent dielectric layers, except for the two outermost conductive layers, which adhere to only one dielectric layer.

In accordance with an aspect of the invention, separate ground planes are provided for analog and digital signals. A dash line 40 across upper dielectric layer 12 of FIG. 1 divides the broad upper side of the printed circuit board into left and right portions. The left portion is designated as 42, and the right portion is designated as 44. The left portion 42 is the portion which is associated with an analog ground plane, and right portion 44 is a portion which is associated with a digital ground plane.

In FIG. 1, analog signal is brought to assemblage 10 by way of a coaxial cable 46 including a center conductor 48 and an outer conductor 50. Center conductor 48 is coupled onto one end of upper analog signal carrying path or trace 22. The end of outer conductor 50 of coaxial cable 46 which is adjacent the feed end of conductive path 22 is connected to a conductive pin 52 which extends through a hole drilled through the various layers of board 11. For example, conductive pin 52 extends through a hole 54 in conductor 24. Those skilled in the art know that pin 52 may make a connection to conductor 24 and to any other conductive layers of the multilayer printed circuit board by the use of plated-through holes, or may avoid contact to conductors of a particular layer by photolithographically etching away a space about the pin. In the case of pin 52, a connection is desired to conductor 24, and therefore hole 54 provides a plated-through connection between the pin and conductor 24.

Conductor 24 is a ground plane which underlies the analog signal carrying traces of analog portion 42 of the board, such as path 22. Those skilled in the art know that high frequency performance of a printed circuit board may be improved by defining signal paths in the form of transmission lines. As illustrated, conductive path 22 together with conductive ground plane 24 and intermediate dielectric material 12, forms a type of transmission line known as microstrip. Microstrip transmission lines are well known, and take the illustrated form of a conductive strip spaced by a dielectric material from a ground plane. The crosssectional width of the conductive strip is selected in conjunction with the thickness of the dielectric material and its dielectric constant to produce a desired characteristic impedance. A typical characteristic impedance is in the range of 70 to 100 ohms. The end of path 22 extends to a point near dash line 40 representing the boundary between the analog and digital portions of the printed circuit board.

Near boundary line 40, a plurality of mounting holes are formed in the printed circuit board. For simplicity, not all the holes are illustrated, nor are the illustrated holes illustrated in all layers. The pattern of holes is selected to match the pin pattern of an analog-to-digital integrated circuit 64. As illustrated in FIG. 1, one of the mounting holes is designated 60 and is formed in the end of path 22 for allowing a connection between analog input signal path 22 and an input pin 62 of integrated circuit 64. The integrated circuit mounting holes such as hole 60 are located near the boundary 40 so that analog signals may be brought to integrated circuit 64 by microstrip transmission line associated with an analog ground plane, and digital signals generated by the integrated circuit may be coupled out relative to a digital ground plane. Conductive ground plane 24 extends across about half of the printed circuit board, to a region near boundary line 40. Slot 66, which is cut through the conductive upper surface overlying dielectric 14, divides the conductive portion into analog ground plane 24 and further conductive surface 68. Since conductive surface 68 is not connected to ground plane 24, it may perform other functions, or be eliminated by an etching process which removes the conductor layer in this region.

As illustrated in FIG. 1, analog ground plane 24 includes a tab portion 70 which extends beyond dividing line 40. The purpose of tab 70 is to extend analog ground 24 into a region at which connection may be made to a digital ground plane, as described below.

Positive (+) and negative (−) power supply connections are made to assemblage 10 by means of a pair of wires illustrated as 72 and 74 which make connection to conductive pins 76 and 78, respectively, which extend through holes 79 and 81, and which are isolated from ground conductor 24 by clearance holes 80 and 82, respectively in ground conductor 24, and which make electrical connection with conductive paths 26 and 28, respectively, on the third and fourth layers of conductor. Path 26 extends from hole 79 to a location on the board under a further clearance hole 84, and path 28 extends from hole 81 to a location under a further clearance hole 86, to which pins 88 and 90 of a voltage regulator 92 make contact. Voltage regulator 92 and other similar voltage regulators (not illustrated) condition the raw power received from paths 26 and 28, and couple the power over further paths (not illustrated) in the third and fourth conductive layers of the board, to power integrated circuits 64 and other ancillary circuits. Providing power in the described manner avoids having power currents flowing in analog ground conductor 24 or through other ground conductors and thereby lowers the overall noise level.

As mentioned, a gap 96 lying substantially under dividing line 40 divides conductive surface 30 into a digital ground plane 30b and a further conductive surface 30a. Digital ground plane 30b includes a tab region 98 which lies under tab region 70, so that analog ground conductor 24 and digital ground conductor 30b are coextensive in a region. A set of through holes 100, 102 extends through printed circuit board 11 within tab portion 70 of the analog ground plane 24 and tab portion 98 of digital ground plane 30b. Through holes 100 and 102 are located so that, when integrated circuit 64 is mounted in place, analog ground pin 104 and digital ground pin 106 extend through holes 100 and 102, respectively, to make contact with both analog and digital ground planes. Other pins (not illustrated) may extend through the board in tab regions 70 and 98 to improve the interconnection between grounds 24 and 30b by reducing the interconnecting resistance or inductance. This interconnection at tabs 70 and 98 is the only ground connection which is common to both analog ground plane 24 and to digital ground plane 30b.

Grounding at a single location in this fashion reduces the possibility of the flow of currents through the grounds in a loopwise fashion and consequent undesired coupling of analog and digital signal path, which is known to result in noise.

Analog-to-digital converter integrated circuit 64 includes a further plurality of pins, one of which is illustrated as 110, at which digital output signals are generated. Pin 110 extends through a through hole 112, and is isolated from conductor 68 by a clearance hole 113 and from ground conductor 30b by a clearance hole 114, to make contact with a digital signal conductor or path, which is illustrated in part as 32. Conductive path 32 extends to a point under a further clearance hole 116. A through hole 117 provides a location for a pin (not illustrated) of a differential driver illustrated as 120. Differential driver 120, and other similar differential drivers, receive single ended digital signals, and convert the single ended digital signals into differential digital signals for coupling to an off board utilization apparatus (not illustrated). Differential driver 120 is illustrated as having a pair of differential drive output pins 122, 124 which extend through holes 126 and 128, respectively, and past clearance holes such as 130 and 132, respectively, to make contact with differential drive output signal paths 34 and 36, respectively. The differential drive eliminates the need to have any connection of an off-board user apparatus to digital ground plane 30b.

Other embodiments of the invention will be apparent to those skilled in the art. For example, the analog signal applied over coaxial cable 46 to the analog portion of the system may be isolated from analog ground conductor 24 by the use of a transformer, as is well known in the art. While a single integrated circuit has been illustrated for conversion of the analog signal into digital form, a set of plural integrated circuits may be used in known fashion, with the digital signals and input analog signal handled as described above, and with any inter-integrated-circuit analog signals, as for example intermediary analog signals, being carried on the analog side of dividing line 40. Clock signals may be carried by a coaxial cable directly to a particular pair of inputs of the integrated circuit(s), or a portion of the third and fourth layer board may be used, as desired. While dividing line 40 and gaps 66 and 96 are illustrated as being substantially straight, when many ground connections must be made to the various grounds, the dividing line may be irregular.

What is claimed is:

1. An analog-to-digital converter arrangement, comprising:
a six-layer printed-circuit board, said printed-circuit board defining a broad region upon which components may be mounted, said broad region being divided into separate analog and digital portions having limited overlap, a first layer of said printed-circuit board defining analog signal-carrying paths, a second layer of said board defining an analog ground plane underlying said analog portion of said broad region and said first layer, third and fourth layers of said board being arranged with paths for carrying operating power to components mounted on said board, a fifth layer of said board defining a digital ground plane underlying said digital portion of said broad region, and a sixth layer of said printed-circuit board defining digital signal carrying paths;

an analog-to-digital converter integrated circuit including a plurality of interface pins mounted in said printed-circuit board, said pins including at least one analog ground pin and one digital ground pin, at least one analog signal input voltage pin, and plural digital output pins, said integrated circuit being mounted adjacent said overlap, with said analog signal input voltage pin making electrical contact only with one of said paths of said first layer, with said plural digital output pins making contact only with corresponding ones of said digital signal carrying paths, and with said analog and digital ground pins extending through said board and contacting both said analog and digital ground planes, whereby connection between said analog and digital ground planes occurs only in a region near said analog and digital ground pins;

energizing power conditioning means mounted on said board and making electrical contact only with said paths of said third and fourth layers for receiving power, and for conditioning said power, and for applying conditioned power to at least said integrated circuit for energization thereof; and differential driving means coupled to said digital signal carrying paths and to said digital ground plane and adapted to be coupled to an off-board load, for receiving said digital signals from said integrated circuit by way of said digital signal carrying paths, and for generating differential signals in response to said digital signals, for thereby avoiding the need to make connection to said digital ground plane in order to utilize said digital signals.

2. An arrangement according to claim 1, wherein said signal-carrying paths of said first layer have widths bearing a predetermined ratio to the spacing between said first and second layers which depends upon the dielectric constant of the material separating said first and second layers.

3. An analog-to-digital converter arrangement, comprising:

a multilayer printed-circuit board, said printed-circuit board defining a broad region upon which components may be mounted, said broad region being divided into separate analog and digital portions having only limited overlap, a first layer of said printed-circuit board defining analog signal-carrying paths in said analog portion, a second layer of said board defining an analog ground plane underlying said analog portion of said broad region and said first layer, at least a third layer of said board being arranged with paths for carrying operating power to components mounted on said board, a fourth layer of said board defining a digital ground plane underlying said digital portion of said broad region, and a fifth layer of said printed-circuit board defining digital signal carrying paths;

an analog-to-digital converter integrated circuit including a plurality of interface pins mounted in said printed-circuit board, said pins including at least one analog ground pin and one digital ground pin, at least one analog signal input voltage pin, and plural digital output pins, said integrated circuit being mounted adjacent said overlap, with said analog signal input voltage pin making electrical contact only with one of said paths of said first layer, with said plural digital output pins making contact only with corresponding ones of said digital signal carrying paths, and with said analog and digital ground pins extending through said board and contacting both said analog and digital ground planes, whereby connection between said analog and digital ground planes occurs only in a region near said analog and digital ground pins;

energizing power conditioning means mounted on said board and making electrical contact only with said paths of said at least third layer for receiving power, and for conditioning said power, and for applying conditioned power to at least said integrated circuit for energization thereof; and differential driving means coupled to said digital signal carrying paths and to said digital ground plane and adapted to be coupled to an off-board load, for receiving said digital signals from said integrated circuit by way of said digital signal carrying paths, and for generating differential signals isolated from said digital ground plane in response to said digital signals, for thereby avoiding the need to make connection to said digital ground plane in order to utilize said digital signals.

4. A method for converting analog signals to digital signals, comprising the steps of:

applying analog signals to be converted to analog signal-carrying paths of a first layer of the analog portion of a multilayer printed circuit board divided into at least separate analog and digital portions, said analog signals being referenced to an analog ground plane defined in a second layer of said printed circuit board and underlying said analog portion, for propagating said analog signals to be converted to an analog signal input port of an analog-to-digital converter integrated circuit;

applying power to paths of at least a third layer of said printed circuit board, for coupling power to at least one power conditioning circuit which produce conditioned power therefrom;

coupling said conditioned power from said power conditioning circuit to said integrated circuit for energization thereof;

generating digital signals within said integrated circuit in response to said analog signals, and coupling said digital signals to digital signal carrying paths of a fourth layer of said printed circuit board overlying a digital ground plane of a fifth layer of said printed circuit board, which digital ground plane lies in said digital portion of said printed circuit board and overlaps with said analog portion only in a common ground region;

coupling said digital signals from said digital signal carrying paths to differential drivers, for converting said digital signals to differential signals isolated from said digital ground plane; and coupling said differential signals to utilization means without connecting said utilization means to said digital ground plane.

* * * * *